United States Patent [19]

Morita

[11] Patent Number: 5,543,688
[45] Date of Patent: Aug. 6, 1996

[54] PLASMA GENERATION APPARATUS WITH INTERLEAVED ELECTRODES AND CORRESPONDING METHOD

[75] Inventor: Katsumi Morita, Matsudo, Japan

[73] Assignee: Applied Materials Inc., Santa Clara, Calif.

[21] Appl. No.: 296,968

[22] Filed: Aug. 26, 1994

[51] Int. Cl.⁶ .................................................. H01J 7/24
[52] U.S. Cl. ........................... 315/111.21; 315/111.71; 315/111.91; 313/231.01; 313/231.31
[58] Field of Search ..................... 315/111.21, 111.31, 315/111.41, 111.71, 111.91; 313/231.01, 231.31; 156/345

[56] References Cited

U.S. PATENT DOCUMENTS

| | | | |
|---|---|---|---|
| 4,786,352 | 11/1988 | Benzing | 156/345 |
| 5,053,678 | 10/1991 | Koike et al. | 315/111.21 X |
| 5,173,641 | 12/1992 | Imahashi et al. | 315/111.21 X |

FOREIGN PATENT DOCUMENTS

| | | |
|---|---|---|
| 60-59728 | 4/1985 | Japan . |
| 2271527 | 11/1990 | Japan . |

*Primary Examiner*—Robert Pascal
*Assistant Examiner*—Haissa Philogene
*Attorney, Agent, or Firm*—Peter J. Sgarbossa; Noel F. Heal

[57] ABSTRACT

A plasma generator having two groups of interleaved electrodes to which power is allied at high or radio frequency, to form a plasma in a region sufficiently removed from a substrate to avoid damage and unwanted exposure of the substrate to the plasma. In one embodiment of the invention, the electrodes are flat parallel plates. One group of electrodes includes all the odd-numbered plates and the other group includes all the even-numbered plates. In another embodiment of the invention, the electrodes are concentric cylinders instead of flat plates. In either case, plasma generation makes use of a relatively large electrode surface area in a small volume, and the resulting plasma is not in direct contact with the substrate being processed.

11 Claims, 4 Drawing Sheets

PLASMA GENERATION APPARATUS WITH INTERLEAVED ELECTRODES AND CORRESPONDING METHOD

BACKGROUND OF THE INVENTION

This invention relates generally to plasma processing and, more particularly, to techniques for generating a plasma in a processing chamber. Plasma processing is widely used in a variety of semiconductor fabrication processes, such as etching, ashing and thin film deposition. Process gases are introduced into a vacuum chamber and a plasma of ions, electrons and other particles is formed from the gases in the chamber. Depending on the specific process being performed, particles in the plasma are accelerated toward a semiconductor wafer or substrate, for deposition or etching. During the processing, the plasma remains in a substantially steady state, although the constituents of the plasma are continuously changing as process gases enter and exit the chamber, gas particles are ionized, ions are recombined with electrons, particles are accelerated out of the plasma, and so forth. An essential feature of plasma processing systems is a mechanism for "activating" the plasma, i.e. for establishing and maintaining the plasma from the process gases that are introduced into the chamber. Typically, the plasma is established and maintained by a radio-frequency (rf) electric field applied to the process gases. However, conventional techniques for establishing and maintaining plasmas in vacuum chambers have significant disadvantages.

In a conventional parallel plate processing chamber, rf power is applied to the chamber through upper and lower parallel-plate electrodes, the lower one of which is typically used to support a semiconductor substrate. The principal drawback of this approach is that the plasma cloud formed between the parallel plates is necessarily in contact, or near contact, with the semiconductor substrate. In most processes, direct exposure of the substrate to the plasma is not desired. Moreover, in plasma processing there is an important distinction between the plasma density, i.e. the density of ions or other active particles in the plasma, and the plasma energy, i.e. the energy of plasma particles impinging on the substrate being processed. Usually it is desirable to be able to control these parameters independently. However, if the electrical power applied to parallel-plate electrodes is increased to raise the plasma density, the effect of the plasma on the substrate will be immediately increased because the substrate is directly exposed to the plasma.

Another conventional plasma processing configuration avoids exposure of the substrate to the plasma by positioning the substrate in a perforated barrel inside the processing chamber. The barrel, sometimes referred to as an etching tunnel, holds a substrate to be etched and the plasma is generated outside the tunnel. This technique has other disadvantages, however. At higher rf powers, the material of the etching tunnel is removed by plasma sputtering and the substrate is subject to contamination. Further, the presence of an etching tunnel makes it difficult to attain uniformity in the processing of large semiconductor wafers.

A more complex plasma generation system is the magnetically enhanced microwave (MEMW) plasma generator. Energy is supplied to the plasma chamber at microwave frequency through a waveguide. A second power generator supplies rf energy through an electrode plate to control the plasma. Magnetic enhancement is applied if a high density plasma is desired, because at microwave frequencies the oscillated electrons in the plasma do not have enough kinetic energy to generate a requisite population of ions for etching. In the presence of an appropriate magnetic field, usually applied through a cylindrical coil around the chamber, the electrons gyrate in resonance with the microwave frequency, a condition referred to as electron cyclotron resonance (ECR). Although the ECR configuration avoids the disadvantages of the other conventional plasma generation systems referred to above, its principal disadvantages are its large size, complexity and cost. Its complexity results in equally complex maintenance procedures and its large size and cost render it unsuitable for many applications.

Another technique for plasma generation uses inductive coupling of rf energy into the vacuum chamber. This, like the magnetically enhanced ECR configuration, has the advantage of "decoupling" the control of plasma density and plasma energy. However, inductively coupled plasma generators also tend to be large, complex and expensive.

It will be appreciated from the foregoing that there is still a need for improvement in plasma generation techniques. Ideally, what is needed is an approach that avoids the disadvantages of parallel-plate and etching tunnel configurations, but also avoids the complexity and cost of magnetically enhanced ECR and inductively coupled systems. The present invention fulfills this need.

SUMMARY OF THE INVENTION

The present invention resides in plasma generation apparatus, and a related method, in which a plasma is generated and maintained by means of two sets of interleaved electrodes. Briefly, and in general terms, the apparatus of the invention includes a vacuum chamber; a plurality of electrode plates disposed in the chamber; a high-frequency power supply connected between a first group of the electrode plates and a second group of the electrode plates interleaved with respect to the first group; and gas inlet means located in the chamber to introduce gas between electrode plates of the first group and electrode plates of the second group. A plasma is formed and maintained in the chamber in the region of the electrode plates, which may be conveniently positioned away from a substrate being processed in the chamber. In one embodiment of the invention, the electrode plates are flat parallel plates. The first group of electrodes includes only odd-numbered electrodes; and the second group of electrodes includes only even-numbered electrodes. In the preferred embodiment, the gas inlet means includes multiple nozzles, each of which is positioned between an electrode plate of the first group and an electrode plate of the second group.

In another embodiment of the invention, the electrode plates are concentric cylinders rather that flat plates. The first group of electrodes includes only odd-numbered electrodes; and the second group of electrodes includes only even-numbered electrodes.

In terms of a novel method, the invention comprises the steps of disposing a plurality of similar electrodes in a processing chamber; connecting some of the electrodes in common as a first group and the remaining electrodes in common as a second group; applying a high-frequency power signal between the first and second groups of electrodes; introducing process gases into the chamber between electrodes of the first and second groups; generating a plasma in the region of the electrodes, which may be conveniently spaced apart from a substrate to be processed in the chamber.

It will be appreciated from the foregoing that the present invention represents a significant advance in the field of plasma generation systems. In particular, the invention provides a simple plasma generator that operates efficiently in a small volume, does not expose the substrate directly to the plasma and does not involve complex and costly apparatus. Other aspects and advantages of the invention will become apparent from the following more detailed description, taken in conjunction with the accompanying drawings.

DESCRIPTION OF THE PREFERRED EMBODIMENTS

Figure 3:
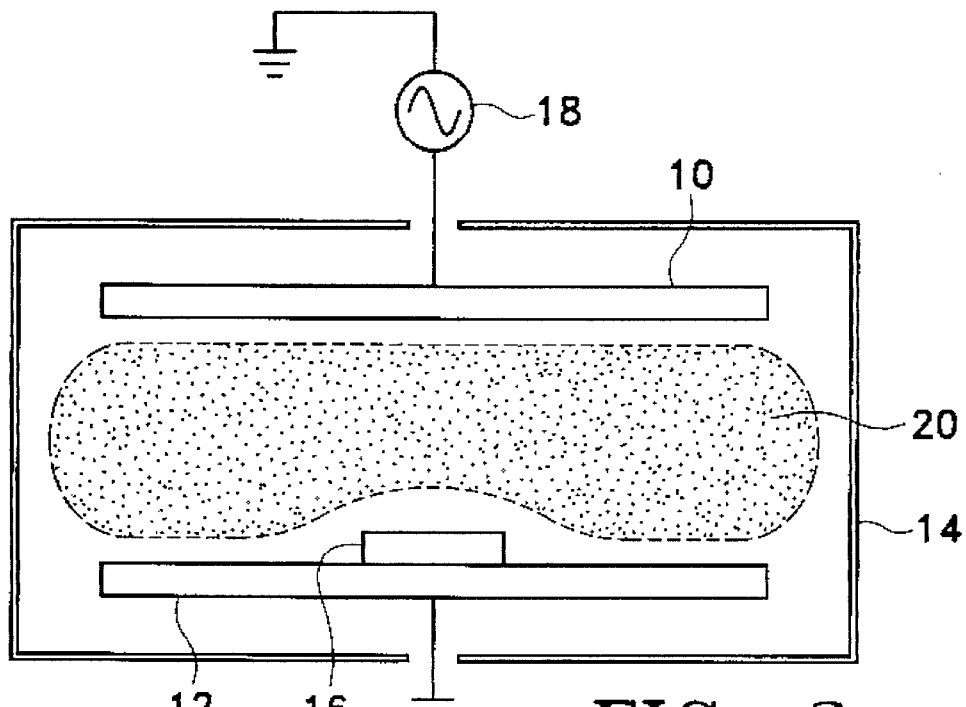
FIG. 3 is diagrammatic elevational view of a parallel-plate plasma generator of the prior art.

As shown in the drawings for purposes of illustration, the present invention pertains to a novel system of plasma generation. In a parallel-plate plasma generator of the prior art, as shown in FIG. 3, a plasma is generated between an upper plate 10 and a lower plate 12 in a vacuum chamber 14. The lower plate 12 supports a semiconductor substrate 16 for processing in the chamber. A high frequency signal, typically a radio frequency (rf) signal, is generated by an oscillator 18 connected between the upper and lower plates 10 and 12. Process gases are supplied to the chamber 14 through appropriate ports (not shown) and the chamber is evacuated through other appropriate ports. The rf energy supplied through the plates 10 and 12 generates and sustains a plasma 20 between the plates, but the substrate 16 is directly exposed to the plasma.

Figure 4:
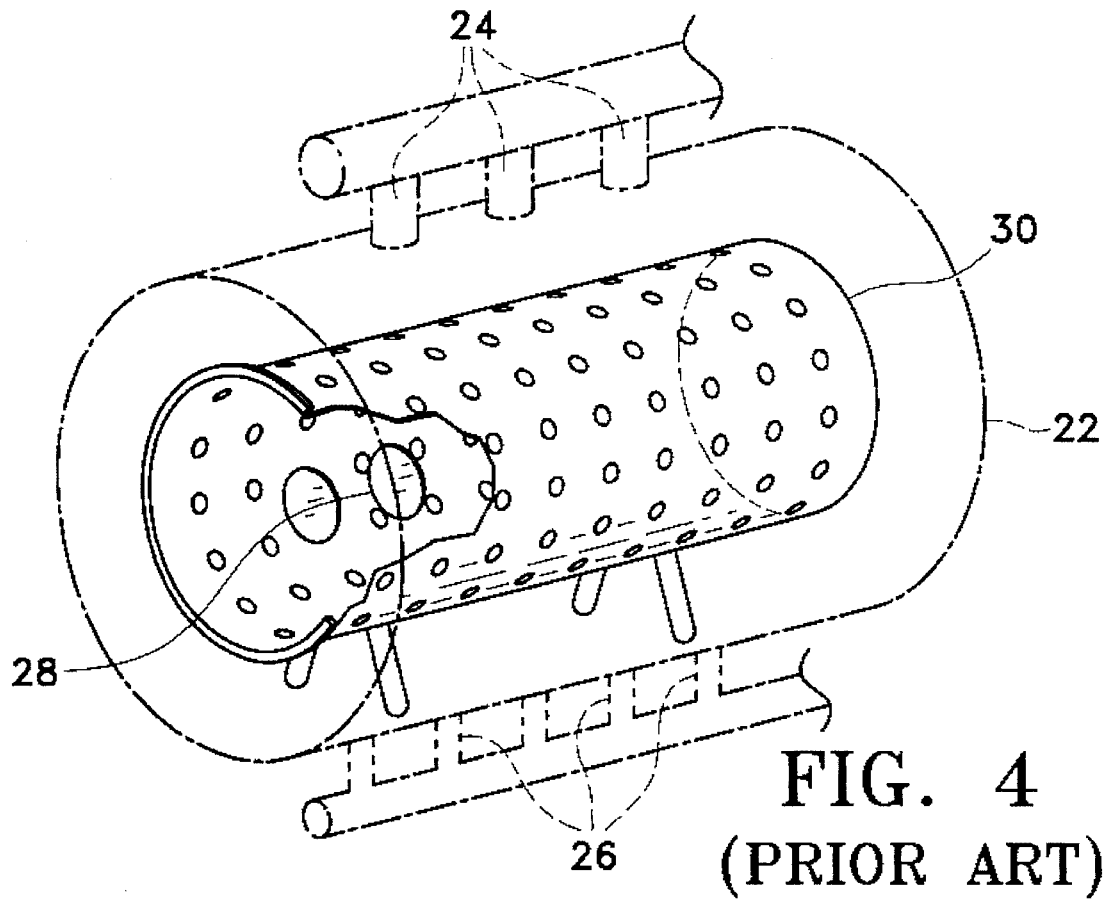
FIG. 4 is a diagrammatic isometric view of an etching tunnel plasma generator of the prior art.
Figure 5:
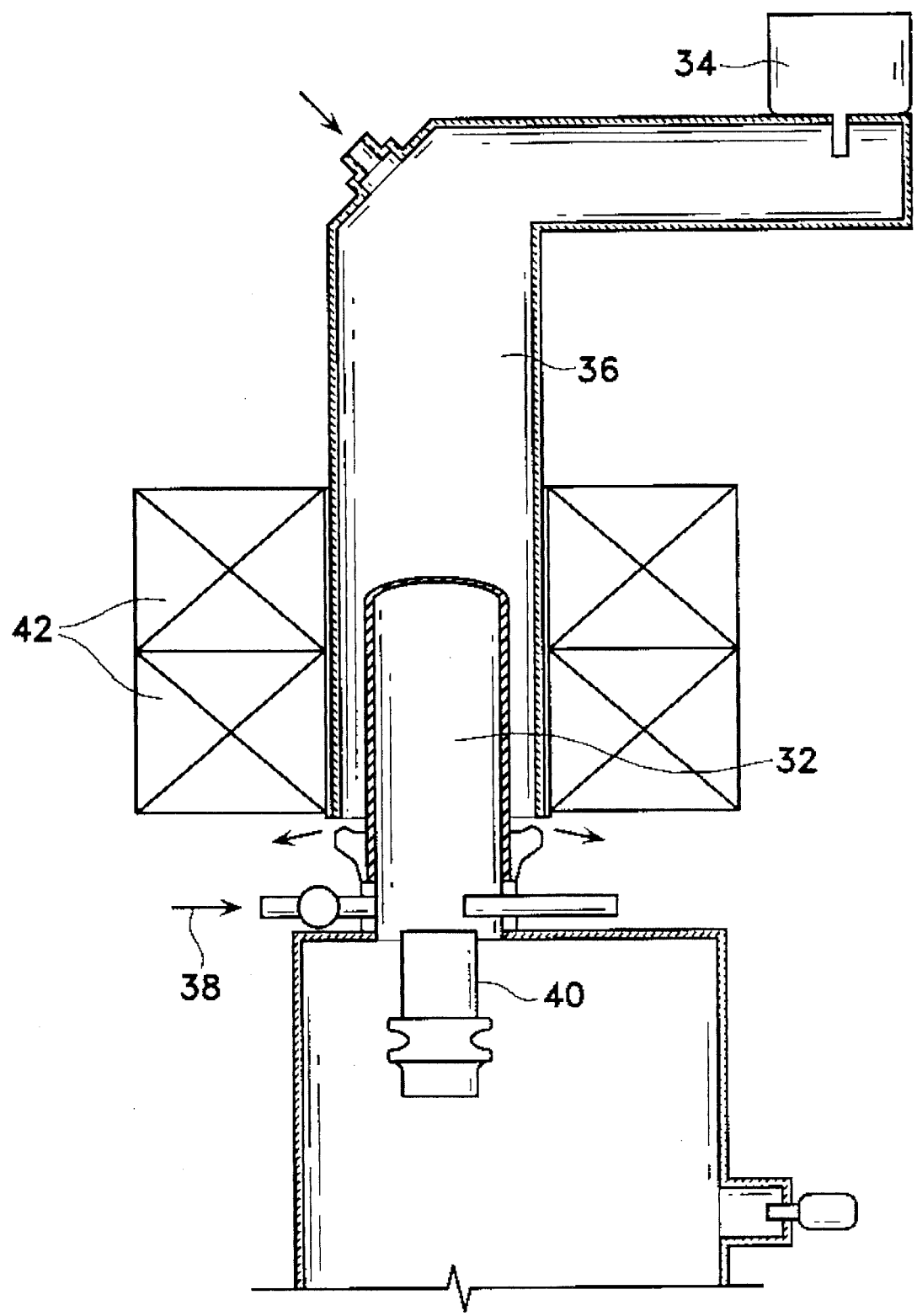
FIG. 5 is a diagrammatic elevational view of a magnetically enhanced plasma generator of the prior art using electron cyclotron resonance (ECR).

An alternative plasma generator of the prior art is shown in FIG. 4. A processing chamber 22 has gas inlet ports 24 and gas exhaust ports 26 and, to avoid direct exposure to the plasma, a semiconductor substrate 28 is positioned inside an etching tunnel 30. The tunnel 30 takes the form of a hollow perforated tube supported in the chamber 22. A plasma is generated outside the etching tunnel 30, thereby avoiding the principal disadvantage of the parallel-plate plasma generator, but the tunnel 30 is subject to plasma sputtering at higher powers, thereby exposing the substrate 28 to unwanted contamination.

In a magnetically enhanced electron cyclotron resonance (ECR) plasma processing system, a plasma is formed in a discharge chamber 32, to which energy is coupled from a magnetron 34 or other source of microwave energy, through a waveguide 36. Gas is introduced into the chamber, as indicated at 38, and a substrate (not shown) is positioned on a table 40. A magnetic field is generated by coils 42. The apparatus avoids direct exposure of the substrate to the plasma and allows independent control of the plasma density and energy. However, the apparatus is large, complex, and expensive to construct and maintain.

Figure 1:
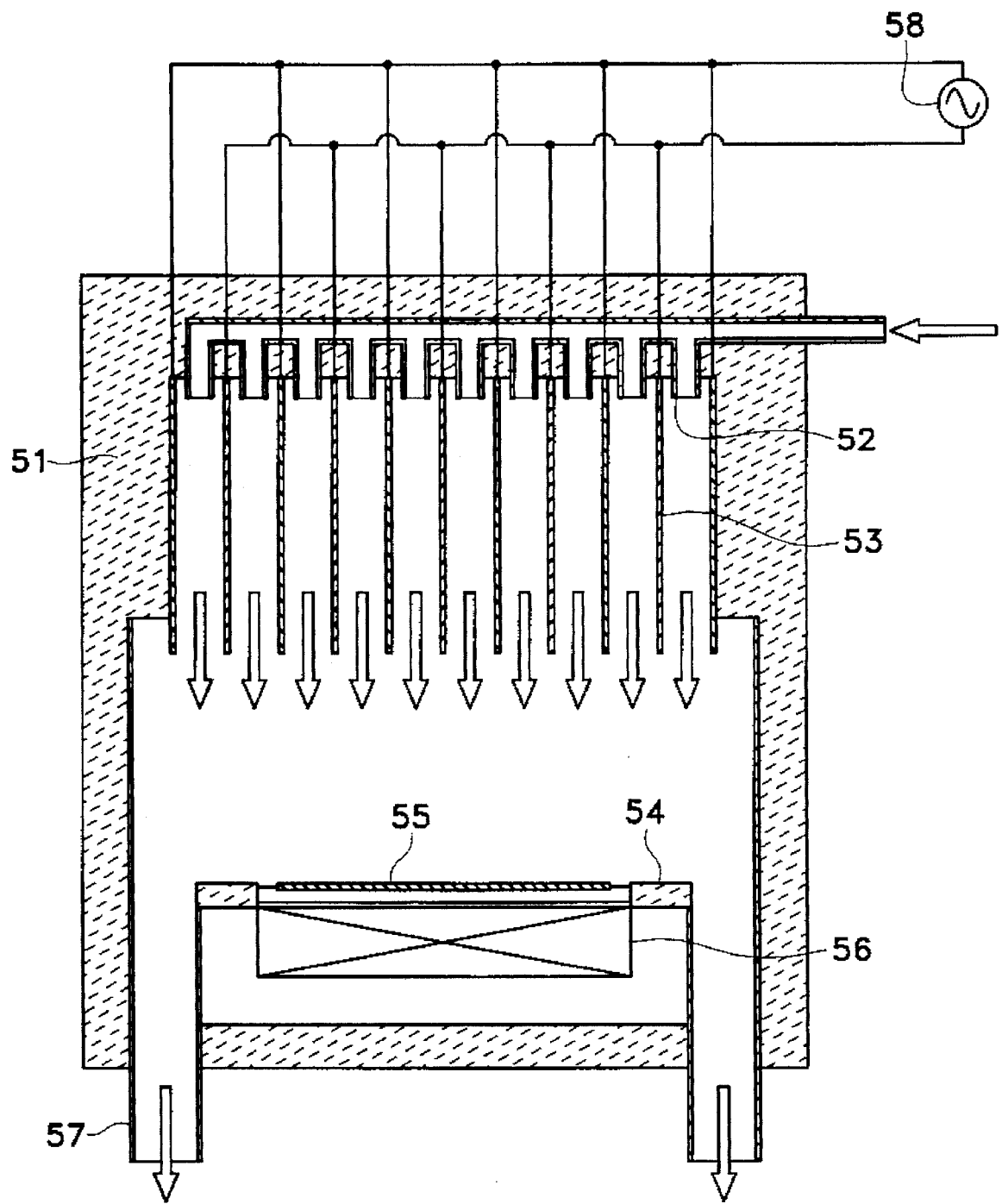
FIG. 1 is a diagrammatic sectional view of a plasma processing chamber including a first embodiment of the present invention.

In accordance with the invention, a plasma is generated at a location somewhat removed from the substrate, using two sets of interleaved electrodes. As best shown in FIG. 1, one embodiment of the invention includes a vacuum chamber 51, multiple nozzles 52 through which process gases are introduced into the chamber, and a plurality of flat electrode plates 53 disposed in the chamber in such a way that each of the nozzles 52 is positioned between two adjacent plates. A substrate holder 54 supports a substrate 55 near the bottom of the chamber 51, and a heating or cooling device 56 may be located immediately beneath the substrate to control its temperature during processing. Exhaust outlets 57 are located near the bottom of the chamber 51.

Figure 2A:
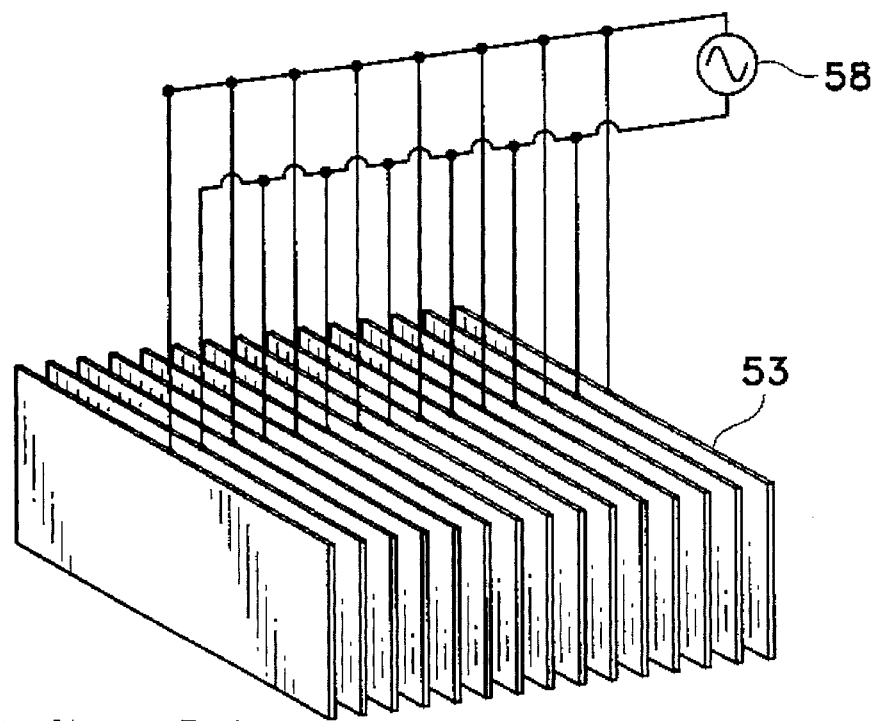
FIG. 2A is a diagrammatic isometric view of an electrode structure used in the embodiment of FIG. 1.

All the odd-numbered plates 53 are connected together and form one electrode of the plasma generator, and all the even-numbered plates are connected together to form the other electrode. The two electrodes are connected to opposite terminals of a high-frequency generator 58. One set of the plates 53 has one more member than the other set, so that each of the nozzles 52 will be positioned between two plates associated with opposite electrodes. FIG. 2A shows the flat-plate electrodes in an isometric view.

Figure 2B:
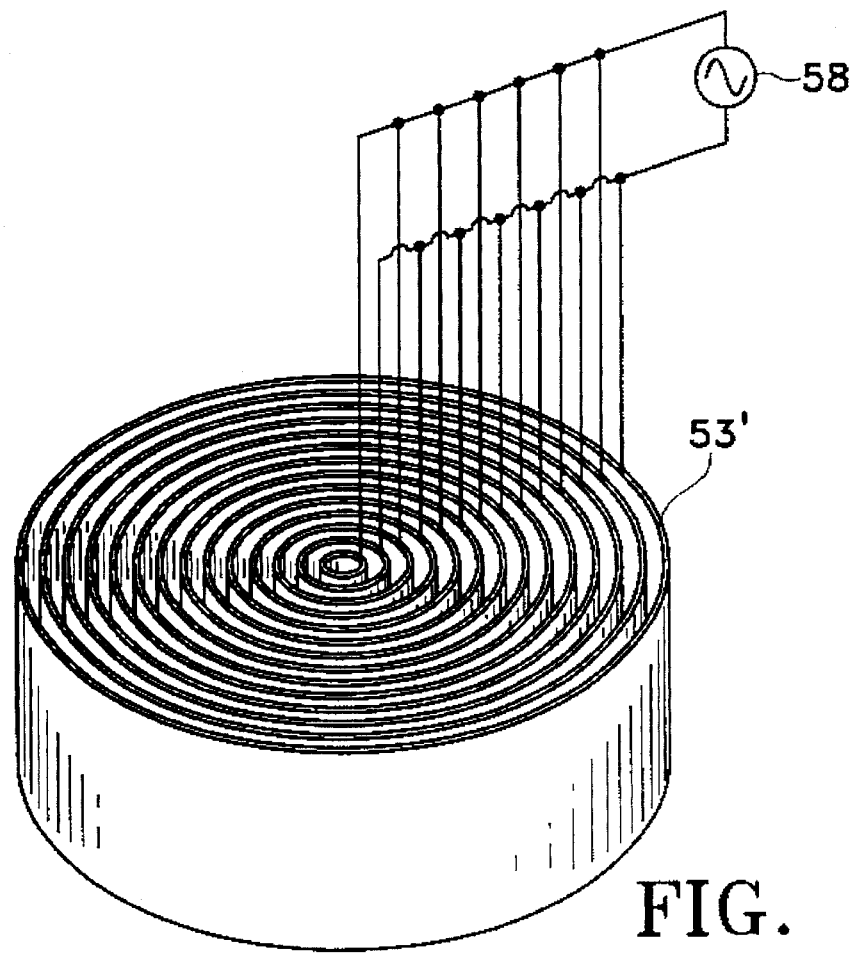
FIG. 2B is a diagrammatic isometric view of an alternative electrode structure in accordance with the invention.

FIG. 2B illustrates another embodiment of the invention, in which the electrodes, indicated at 53', are concentric cylinders. About half of the cylinders, such as the odd-numbered ones, are connected together and form one electrode of the device, while the other, even-numbered ones are connected together to form the other electrode. As in the first embodiment, the plasma is formed between the two sets of electrodes and is separated from the substrate being processed.

It will be appreciated from the foregoing that the present invention represents a significant advance in the field of plasma generators. In particular, the invention provides a plasma generator that is relatively compact, because electrode interleaving results in a relatively large electrode surface area in a small space. An important feature is that, because the plasma is not formed in contact with the substrate, the plasma density may be increased, by raising the power applied to the electrodes, without significantly affecting the power density seen by the substrate. Moreover, the apparatus operates without damaging the substrate surface, and without inducing unwanted sputtering. Other advantages are that the device of the invention is of simple construction, so is relatively easy and inexpensive to manufacture, and that it can conveniently accommodate relatively large semiconductor wafers while still maintaining uniformity of processing.

It will also be appreciated that, although two embodiments of the invention have been described in detail for purposes of illustration, various modifications may be made without departing from the spirit and scope of the invention. Accordingly, the invention should not be limited except as by the appended claims.

I claim:

1. Plasma generation apparatus, comprising:

a vacuum chamber including a substrate support for supporting a substrate to be processed within said chamber;

a plurality of electrode plates disposed in the chamber;

a high-frequency power supply connected between a first group of the electrode plates and a second group of the electrode plates interleaved with respect to the first group; and a gas inlet located in the chamber to flow gas between electrode plates of the first group and electrode plates of the second group and thereafter toward said substrate support;

whereby a plasma is formed and maintained in the chamber in the region of the electrode plates, which region is spaced away from said substrate being processed in the chamber.

2. Plasma generation apparatus as defined in claim 1, wherein:

the electrode plates are concentric cylinders;

the first group of electrodes includes only odd-numbered electrodes; and the second group of electrodes includes only even-numbered electrodes.

3. The apparatus of claim 1, wherein at least portions of both said electrode plates of said first group and said electrode plates of said second group are disposed between said gas inlet and said substrate support.

4. Plasma generation apparatus, comprising:

a vacuum chamber;

a plurality of electrode plates disposed in the chamber;

a high-frequency power supply connected between a first group of the electrode plates and a second group of the electrode plates interleaved with respect to the first group; and gas inlet means located in the chamber to introduce gas between electrode plates of the first group and electrode plates of the second group;

whereby a plasma is formed and maintained in the chamber in the region of the electrode plates, which may be conveniently spaced away from a substrate being processed in the chamber;

wherein the electrode plates are flat parallel plates;

the first group of electrodes includes only odd-numbered electrodes; and the second group of electrodes includes only even-numbered electrodes.

5. Plasma generation apparatus, comprising:

a vacuum chamber;

a plurality of electrode plates disposed in the chamber;

a high-frequency power supply connected between a first group of the electrode plates and a second group of the electrode plates interleaved with respect to the first group; and gas inlet means located in the chamber to introduce gas between electrode plates of the first group and electrode plates of the second group;

whereby a plasma is formed and maintained in the chamber in the region of the electrode plates, which may be conveniently spaced away from a substrate being processed in the chamber;

wherein the electrode plates are flat parallel plates, the first group of electrodes includes only odd-numbered electrodes, the second group of electrodes includes only even-numbered electrodes, and the gas inlet means includes multiple nozzles, each of which is positioned between an electrode plate of the first group and an electrode plate of the second group.

6. Plasma generation apparatus, comprising:

a vacuum chamber;

a plurality of electrode plates disposed in the chamber;

a high-frequency power supply connected between a first group of the electrode plates and a second group of the electrode plates interleaved with respect to the first group; and gas inlet means located in the chamber to introduce gas between electrode plates of the first group and electrode plates of the second group;

whereby a plasma is formed and maintained in the chamber in the region of the electrode plates, which may be conveniently spaced away from a substrate being processed in the chamber;

wherein the electrode plates are concentric cylinders, the first group of electrodes includes only odd-numbered electrodes, the second group of electrodes includes only even-numbered electrodes, and the gas inlet means include multiple nozzles, each of which is positioned between a cylindrical electrode plate of the first group and a cylindrical electrode plate of the second group.

7. A method for generating a plasma in a vacuum processing chamber, the method comprising the steps of:

disposing a plurality of similar flat parallel plate electrodes in a processing chamber;

connecting some of the electrodes in common as a first group and the remaining electrodes in common as a second group;

applying a high-frequency power signal between the first and second groups of electrodes;

introducing process gases into the chamber between electrodes of the first and second groups; and generating a plasma in the region of the electrodes, which may be conveniently spaced apart from a substrate to be processed in the chamber.

8. A method for generating a plasma in a vacuum processing chamber, the method comprising the steps of:

disposing a plurality of similar electrodes in a processing chamber;

connecting some of the electrodes in common as a first group and the remaining electrodes in common as a second group;

applying a high-frequency power signal between the first and second groups of electrodes;

introducing process gases into the chamber between electrodes of the first and second groups; and generating a plasma in the region of the electrodes, which may be conveniently spaced apart from a substrate to be processed in the chamber;

wherein the step of disposing similar electrodes includes disposing flat parallel plate electrodes in the chamber; and the step of introducing process gases includes introducing process gases though separate nozzles, each of which is disposed between an electrode of the first group and an electrode of the second group.

9. A method for generating a plasma in a vacuum processing chamber, the method comprising the steps of:

disposing a plurality of similar electrodes in a processing chamber;

connecting some of the electrodes in common as a first group and the remaining electrodes in common as a second group;

applying a high-frequency power signal between the first and second groups of electrodes;

introducing process gases into the chamber between electrodes of the first and second groups; and generating a plasma in the region of the electrodes, which may be conveniently spaced apart from a substrate to be processed in the chamber;

wherein the step of disposing similar electrodes includes disposing concentric cylindrical electrodes in the chamber; and the step of introducing process gases includes introducing process gases though separate nozzles, each of which is disposed between a concentric cylindrical electrode of the first group and a concentric cylindrical electrode of the second group.

10. A plasma processing method, comprising the steps of:

placing a substrate to be processed on a support disposed within a vacuum processing chamber;

generating a plasma between plural first electrode plates interleaved with plural second electrode plates by applying an electrical signal between said first and second electrode plates; and exposing said substrate to said plasma.

11. The method of claim 10, wherein said exposing step includes flowing a processing gas between said first and second electrode plates toward said support.

* * * * *